United States Patent
Villarreal, Jr.

(10) Patent No.: US 8,551,280 B2
(45) Date of Patent: Oct. 8, 2013

(54) SOLID-CORE PANEL INCORPORATING DECORATIVE AND/OR FUNCTIONAL MATERIAL

(76) Inventor: Jesse Villarreal, Jr., Bend, OR (US)

( * ) Notice: Subject to any disclaimer, the term of this patent is extended or adjusted under 35 U.S.C. 154(b) by 285 days.

(21) Appl. No.: 12/726,080

(22) Filed: Mar. 17, 2010

(65) Prior Publication Data

US 2011/0229663 A1   Sep. 22, 2011

(51) Int. Cl.
*C09J 5/02* (2006.01)
(52) U.S. Cl.
USPC .......... 156/307.4; 156/60; 156/228; 156/242; 156/295; 156/307.1; 156/307.3; 156/313
(58) Field of Classification Search
USPC ................ 156/60, 99, 228, 242, 295, 307.1, 156/307.3, 307.4, 313
See application file for complete search history.

(56) References Cited

U.S. PATENT DOCUMENTS

| | | | |
|---|---|---|---|
| 3,391,053 A | 7/1968 | Kolb |
| 3,616,185 A | 10/1971 | Goldberg |
| 4,219,598 A | 8/1980 | Noma et al. |
| 4,746,560 A | 5/1988 | Goeden |
| 5,336,354 A | 8/1994 | Looi et al. |
| 5,352,532 A | 10/1994 | Kline |
| 5,474,837 A | 12/1995 | Duke |
| 5,545,446 A | 8/1996 | Looi et al. |
| 5,695,848 A | 12/1997 | Wilkins et al. |
| 5,759,658 A | 6/1998 | Piekos |
| 6,984,283 B1 | 1/2006 | Norlega |
| 7,160,605 B2 | 1/2007 | Fusco |
| 2001/0010367 A1 | 8/2001 | Burnell-Jones |
| 2005/0152139 A1 | 7/2005 | Loving et al. |
| 2009/0253325 A1 | 10/2009 | Brookstein |

FOREIGN PATENT DOCUMENTS

WO   2011116144   9/2011

OTHER PUBLICATIONS

United States Patent and Trademark Office—International Search Authority; Search Report and Written Opinion PCT/US2011/028740; May 25, 2011; 9 Pages.
The International Bureau of WIPO; PCT/US2011/028740, International Preliminary Report on Patentability; Sep. 18, 2012; 7 pages.

*Primary Examiner* — Andrew Piziali
(74) *Attorney, Agent, or Firm* — Stolowitz Ford Cowger LLP (57) ABSTRACT

A panel includes a fiberglass substrate encapsulating an aesthetic material. The fiberglass substrate and the aesthetic material are both impregnated with resin to form the solid-core of the panel. The solid-core panel can be manufactured by arranging multiple layers of a fiberglass material between multiple plates, interleaving aesthetic material between at least two of the layers of fiberglass material, applying resin to the multiple layers of fiberglass material and the aesthetic material, and then allowing the combination of the resin, multiple layers of fiberglass material, and the aesthetic material to cure between the plates, forming a solid-core panel encapsulating the aesthetic material.

7 Claims, 8 Drawing Sheets

SOLID-CORE PANEL INCORPORATING DECORATIVE AND/OR FUNCTIONAL MATERIAL

TECHNICAL FIELD

This disclosure relates generally to solid-core panels that incorporate aesthetic material.

BACKGROUND

Transparent or translucent glass panes are often utilized to allow light to illuminate residential and commercial environments. There are many techniques that designers have utilized to enhance the aesthetics of these glass panes. For instance, some glass pane manufacturers bevel or texturize surfaces of panes to render them opaque or to provide a desired design. Another aesthetic-enhancement technique involves adhering decorative window film to smooth surfaces of the glass panes.

Some designers have attempted to replace glass panes, for example, in doors and windows, with plastic or acrylic panels that include a decorative paper or tissue. These plastic panels are produced by laminating two plastic sheets or resin-based panes around the decorative paper or tissue, for example, with glue or other adhesive. The resulting laminate panel is often further enclosed with additional plastic sheets laminated to the exterior of the panel.

While laminated panels allow the decorative paper or tissue to be viewed through the plastic layers, the process of layering multiple sheets around the decorative material can provide poor aesthetics, i.e., due to optical distortion of the decorative paper caused by the layering or adhesive, or due to unintentional incorporation air bubbles between the various layers. Since these plastic panels are laminated, their layers tend to separate over time, allowing water and mold to infiltrate between the layers and into the decorative paper or tissue. The laminated panels are further limited to incorporating only flat paper or tissue capable of adhering to the laminating adhesive.

DETAILED DESCRIPTION

As described above, since previous panels incorporating decorative material are produced through a lamination process—with multiple transparent or translucent sheets are adhered or affixed together around a decorative paper or tissue—the overall aesthetics of the panels suffer due to optical distortion from the layering and lamination, unintentional incorporation of air bubbles, and the eventual layer separation and infiltration of water, mold, and/or particulates. By encapsulating aesthetic or decorative materials into a solid-core panel, the integrity of the aesthetic or decorative material in the panel can be maintained. Embodiments of the solid-core panels and multiple processes for producing the solid-core panels are shown and described below in greater detail.

Figure 1A:
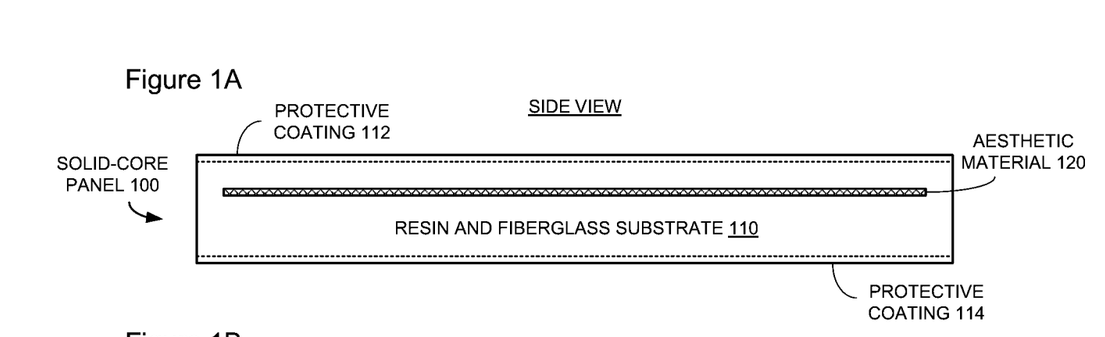
FIGS. 1A-1C are block diagrams of an example solid-core panel incorporating aesthetic material according to embodiments of the invention.
Figure 1B:
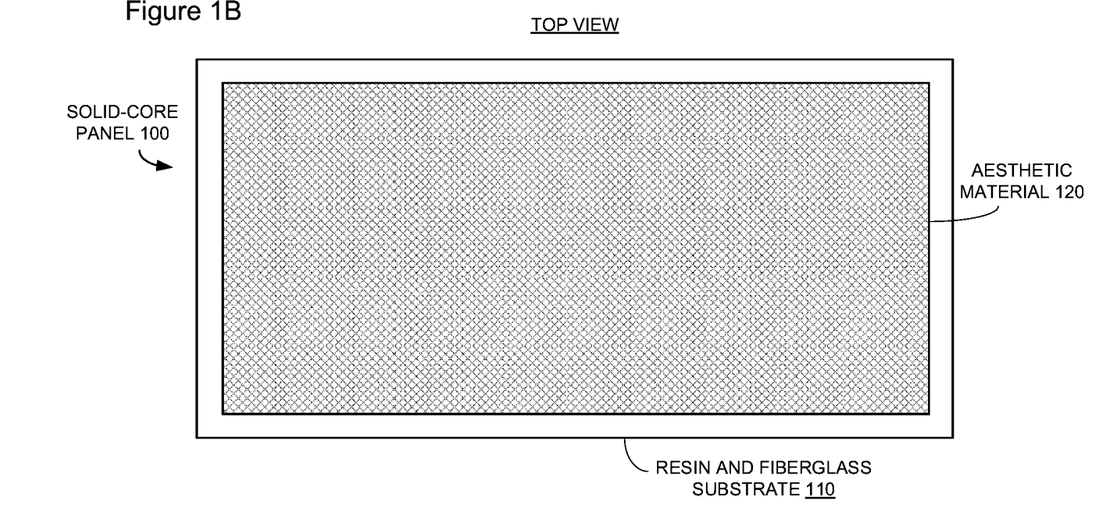

FIGS. 1A-1B are block diagrams of an example solid-core panel 100 incorporating aesthetic material 120 according to embodiments of the invention. Referring to FIGS. 1A and 1B, a side-view and a top-view of a solid-core panel 100 are shown. The solid-core panel 100 includes a resin and fiberglass substrate 110 that encapsulates aesthetic or decorative material 120, which can render the aesthetic material 120 viewable through at least one of the top or bottom surfaces of the solid-core panel 100.

The solid-core panel 100 can be a flat-rectangular panel, as shown in FIGS. 1A and 1B, or the solid-core panel 100 can take on any shape or contour, for example, by having exterior surfaces formed in any number of shapes. The surfaces of the solid-core panel 100 can have various finishes, such as gloss, smooth, mat, or textured finishes. The surfaces can also be stamped or otherwise contoured, for example, with a relief-technique. Embodiments of the production of the solid-core panel 100 will be described below in greater detail.

The aesthetic material 120 can be a relatively planar material, for instance, decorative paper, film, fabric or other woven material, tissue, or other organic material. In some embodiments, the aesthetic material 120 can provide additional functionality beyond aesthetics, for example, the aesthetic material 120 can be a solar fabric or solar-metalized material, such as solar cells, which will be described below in greater detail. The aesthetic material 120 can also be utilized to help reinforce the panel, for example, when the aesthetic material is a carbon fiber mesh or other relatively rigid material.

Although FIGS. 1A and 1B show the aesthetic material 120 as substantially level or parallel with at least one of the surfaces of the solid-core panel 100, in some embodiments, the aesthetic material 120 can be positioned or arranged in non-parallel orientation to provide differing aesthetics to the panel or to provide varied functionality. Because the panel has a solid-core, and not laminated, the aesthetic material 120 can be located anywhere within the solid-core panel 100. In some embodiments, the aesthetic material 120 can be positioned closer to one surface of the solid-core panel 100 to enhance the aesthetics or functionality of the solid-core panel 100. In other embodiments, the aesthetic material 120 can be positioned closer to the middle of the solid-core panel 100 to further embed the aesthetic material 120 in the solid-core panel 100.

The resin and fiberglass substrate 110 can be a combination of a fiberglass base that is impregnated or saturated with resin or a resin-based product. The resin or resin-based product can be a clear or translucent polyester-based resin. Both the fiberglass and the resin can be transparent or translucent, and possibly include pigments or dyes that tint or color the resin and fiberglass substrate 110 in the solid-core panel 100.

The aesthetic material 120 can also be impregnated or saturated with the resin or the resin-based product. The impregnation or saturation of the fiberglass with resin can "wet out" the fiberglass, as well as the aesthetic material 120, giving the fiberglass and the aesthetic material 120 a "wet" look. The impregnation or saturation of the aesthetic material 120 can also preserve the material and protect the aesthetic material 120 from the elements, such as temperature variances, moisture, humidity, and air. Since the solid-core panel 100 encapsulates the aesthetic material 120, the solid-core panel 100 can be utilized any place glass or other transparent or translucent panels are used in commercial, industrial, or residential environments.

Surfaces of the resin and fiberglass substrate 110 can include an integrated protective coating 112 and 114. The protective coating 112 and 114 can be a combination of a polyurethane-based material, a clear coat polymer, or a gel coat polymer, and resin, and possibly the fiberglass. The protective coating 112 and 114 can provide a rigid surface to the solid-core panel 100, which reduces bowing or warping of the solid-core panel 100 and helps prevent scratching, chipping, and fracturing of the solid-core panel. As will be described below in greater detail, the protective coating 112 and 114 can be applied prior to or substantially concurrently with the application of the resin, or can be applied after the resin has begun curing, for example, in sprayed application.

Figure 1C:
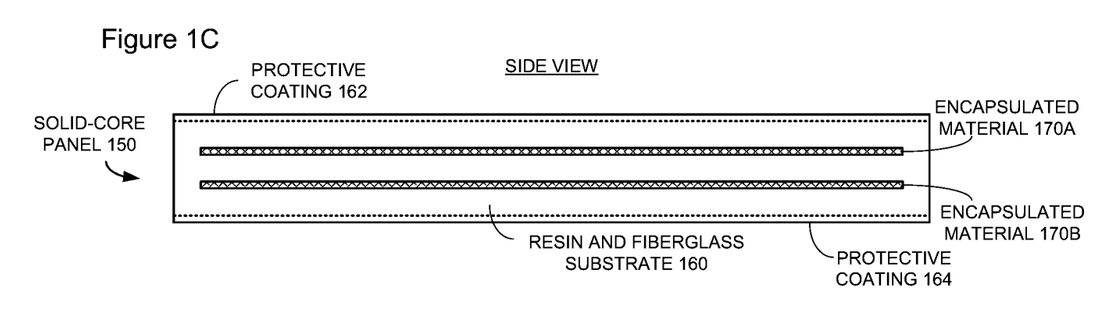

FIG. 1C is a block diagram of another example solid-core panel 150 encapsulating multiple levels of material 170 according to embodiments of the invention. Referring to FIG. 1C, a side-view of the solid-core panel 150 is shown. Solid-core panel 150 is similar to the solid-core panel 100 described above, except the solid-core panel 150 incorporates multiple levels of encapsulated material 170A and 170B.

The encapsulated material 170A and 170B can be similar to the aesthetic material 120 incorporated into solid-core panel 100, albeit in multiple layers. The ability to provide multiple layers of material 170A and 170B allows for many different applications. For instance, the use of multiple material layers can provide a three-dimensional aesthetic to the solid-core panel 150. The multiple material layers can also provide differing visual effects from each viewable side of the panel. For instance, as shown in FIG. 1C, material 170A can be primarily viewable from the top side of the solid-core panel 150, while material 170C can be primarily viewable from the bottom side of the solid-core panel 150.

In many applications, the solid-core panel 150 can have a predominate aesthetic-side, i.e., the side of the panel that is primarily viewable, while the aesthetics of the other side are not as important. In these cases, the material closest to the aesthetic-side can be a decorative material, while the material on the other side can provide some additional functionality. For instance, the functional material can be solar cells capable of producing energy, a solar fabric to disperse direct sunlight, a material that can add rigidity or strength to the panel 150, or even additional electronics, such as back lighting. In other applications, the encapsulated material 170A and 170B can both be functional materials, such as solar cells on both sides of the solid-core panel 150.

Although FIG. 1C shows the encapsulated materials 170A and 170B as substantially level or parallel with the surfaces of the solid-core panel 150, in some embodiments, the encapsulated materials 170A and 170B can be positioned or arranged in non-parallel orientation to provide differing aesthetics to the panel or to provide varied functionality. Because the panel has a solid-core, and not laminated, the aesthetic material 120 can be located anywhere within the solid-core panel 100. In some embodiments, the aesthetic material 120 can be positioned closer to one surface of the solid-core panel 100 to enhance the aesthetics or functionality of the solid-core panel 100. In other embodiments, the aesthetic material 120 can be positioned closer to the middle of the solid-core panel 100 to further embed the aesthetic material 120 in the solid-core panel 100.

Figure 1D:
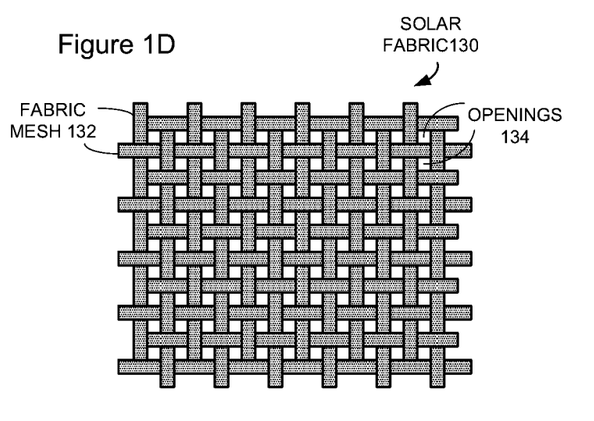
FIG. 1D is a block diagram showing an example aesthetic material incorporated into the solid-core panel shown in FIGS. 1A-1C.

FIG. 1D is a block diagram showing an example aesthetic material 120 or 170A-170B incorporated into the solid-core panels 100 and 150 shown in FIGS. 1A-1C. Referring to FIG. 1D, as discussed above, many materials can be encapsulated within the solid-core panels 100 and 150, including a solar fabric 130 described in FIG. 1D. The previous laminated panels described above, could not incorporate solar fabrics or other fabrics, as the glue or adhesive utilized in the lamination process did not adhere to solar fabrics.

The solar fabric 130 can be comprised of a fabric mesh 132, which creates openings 134 that allow light to pass, while diffusing direct sunlight and some of the radiant heat. The fabric bands can be made of natural or man-made materials. The fabric mesh 132 can include fabric bands that are interleaved or woven into various patterns, such as a basket-weave pattern shown in FIG. 1D.

Figure 2A:
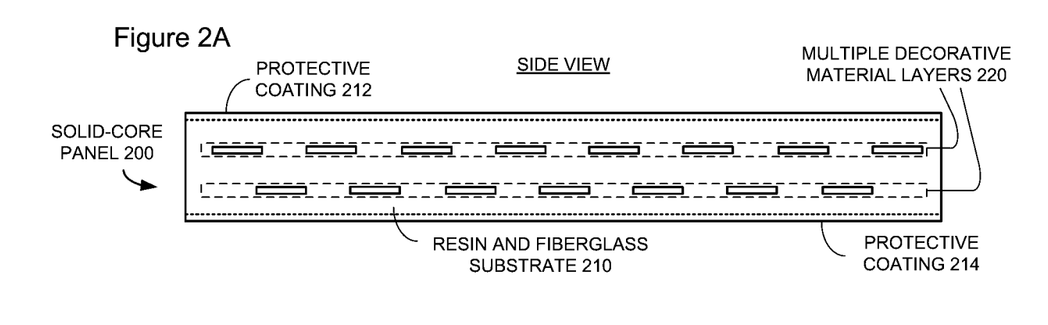
FIGS. 2A and 2B are block diagrams of an example solid-core panel incorporating decorative material according to embodiments of the invention.
Figure 2B:
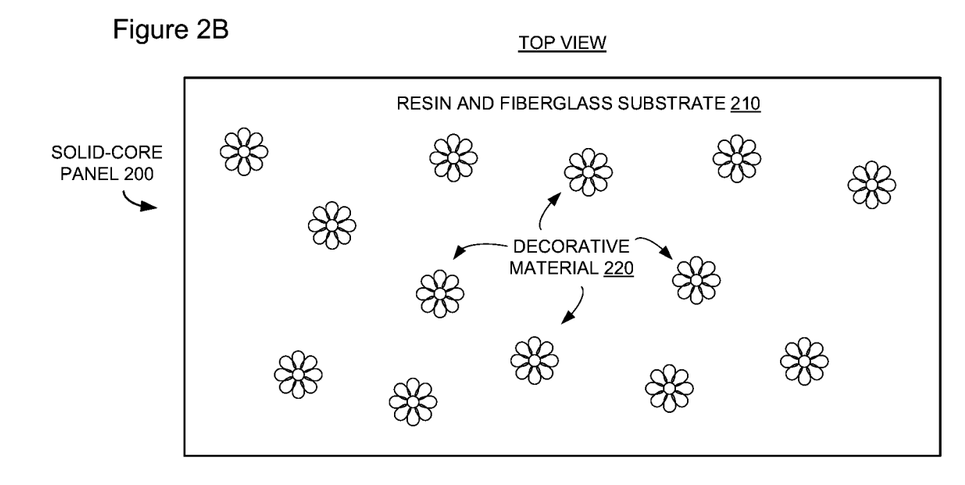

FIGS. 2A and 2B are block diagrams of an example solid-core panel 200 incorporating decorative material according to embodiments of the invention. Referring to FIGS. 2A and 2B, a side-view and a top-view of a multi-level solid-core panel 200 are shown. The multi-level solid-core panel 200 includes a resin and fiberglass substrate 210 that encapsulates multiple decorative material layers 220, which can render the aesthetic material in the layers 220 viewable through at least one of the top or bottom surfaces of the multi-level solid-core panel 200.

Similar to the solid-core panels 100 and 150 shown and described above, the multi-level solid-core panel 200 can be a flat-rectangular panel, as shown in FIGS. 2A and 2B, or can take on any shape or contour. For instance, the multi-level solid-core panel 200 can have exterior surfaces formed in any number of shapes. In some embodiments, the surfaces can be contoured similar to a relief-technique or stamped. The surfaces of the multi-level solid-core panel 200 can also have various finishes, such as smooth, mat, or textured finishes. Embodiments of how the multi-level solid-core panel 200 is produced with these finishes and contours will be described below in greater detail.

The aesthetic or decorative material in the solid-core panel 200 can be arranged in multiple decorative material layers 220. This multiple layering allows the solid-core panel 200 to have a three-dimensional visual image. Although FIG. 2A shows two distinct layers 220, this is not intended to be limiting, as the multi-level solid-core panel 200 can have any number of aesthetic material layers.

In some embodiments, the aesthetic material in the multiple decorative material layers 220 can be a relatively flat material relative to the top and bottom surfaces of the solid-core panel 200, for instance, decorative paper, film, fabric or other woven material, tissue, or other organic material, while in other embodiments, the aesthetic material can be any size. For instance, in FIG. 2B the aesthetic material is a group of flower petals, which can be arranged across the multiple decorative material layers 220. Although FIGS. 2A and 2B show the aesthetic material as substantially level or parallel with at least one of the surfaces of the multi-level solid-core panel 200, in some embodiments, the aesthetic material can be positioned or arranged in non-parallel orientation to provide differing aesthetics to the panel or to provide varied functionality.

The resin and fiberglass substrate 210 in the multi-level solid-core panel 200 is similar to the resin and fiberglass substrate 110 described above in FIGS. 1A and 1B. In this multiple level embodiment, the fiberglass can be utilized to define the location of multiple decorative material layers 220 and hold the aesthetic material in place during production of the solid-core panel 200. Embodiments of the production of multi-level panels will be described below in greater detail.

Surfaces of the resin and fiberglass substrate 110 can include an integrated protective coating 112 and 114. The protective coating 112 and 114 can be a combination of a clear coat, gel coat, polymer, polyurethane-based material and resin, and possibly the fiberglass. The protective coating 112 and 114 can provide a rigid surface to the solid-core panel 100, which reduces bowing or warping of the solid-core panel 100 and helps prevent scratching, chipping, and fracturing of the solid-core panel. As will be described below in greater detail, the protective coating 112 and 114 can be applied prior to or substantially concurrently with the application of the resin, or can be applied after the resin has begun curing, for example, in sprayed application.

Figure 3A:
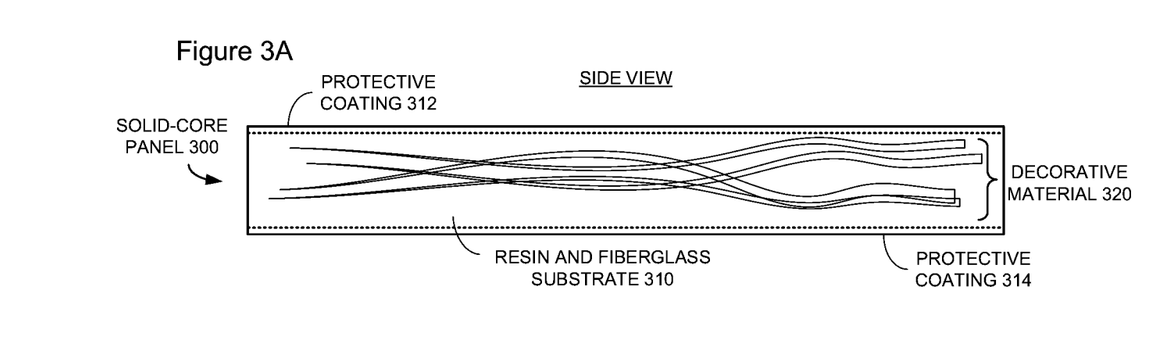
FIGS. 3A and 3B are block diagrams of an example solid-core panel incorporating decorative material according to embodiments of the invention.
Figure 3B:
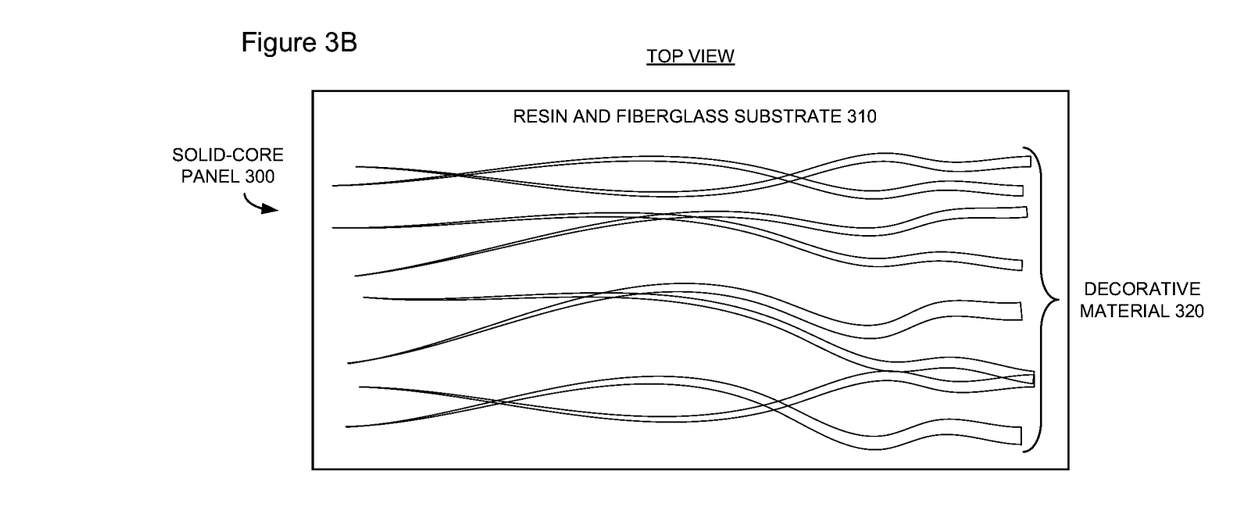

FIGS. 3A and 3B are block diagrams of an example solid-core panel incorporating decorative material according to embodiments of the invention. Referring to FIGS. 3A and 3B, a side-view and a top-view of a solid-core panel 300 are shown. The solid-core panel 300 includes a resin and fiberglass substrate 310 that encapsulates decorative material 320, which can render the decorative material 320 viewable through at least one of the top or bottom surfaces of the solid-core panel 300.

Similar to the solid-core panels 100, 150, and 200 shown and described above, the solid-core panel 300 can be a flat-rectangular panel, as shown in FIGS. 3A and 3B, or can take on any shape or contour. For instance, the solid-core panel 300 can have exterior surfaces formed in any number of shapes. In some embodiments, the surfaces can be contoured similar to a relief-technique or stamped. The surfaces of the solid-core panel 300 can also have various finishes, such as smooth, mat, or textured finishes. Embodiments of how the solid-core panel 300 is produced with these finishes and contours will be described below in greater detail.

The decorative material in the solid-core panel 300 can be arranged anywhere within the solid-core panel 300, which allows the solid-core panel 300 to have a three-dimensional visual image. The resin and fiberglass substrate 310 in the solid-core panel 300 is similar to the resin and fiberglass substrates 110 and 210 described above. In this embodiment, the fiberglass can be utilized to define the location of decorative material 320 and hold the decorative material 320 in place during production of the solid-core panel 300. Embodiments of the production of multi-level panels will be described below in greater detail.

Surfaces of the resin and fiberglass substrate 110 can include an integrated protective coating 112 and 114. The protective coating 112 and 114 can be a combination of a polyurethane-based material, a clear coat polymer, or a gel coat polymer and resin, and possibly the fiberglass. The protective coating 112 and 114 can provide a rigid surface to the solid-core panel 100, which reduces bowing or warping of the solid-core panel 100 and helps prevent scratching, chipping, and fracturing of the solid-core panel. As will be described below in greater detail, the protective coating 112 and 114 can be applied prior to or substantially concurrently with the application of the resin, or can be applied after the resin has begun curing, for example, in sprayed application.

Figure 4:
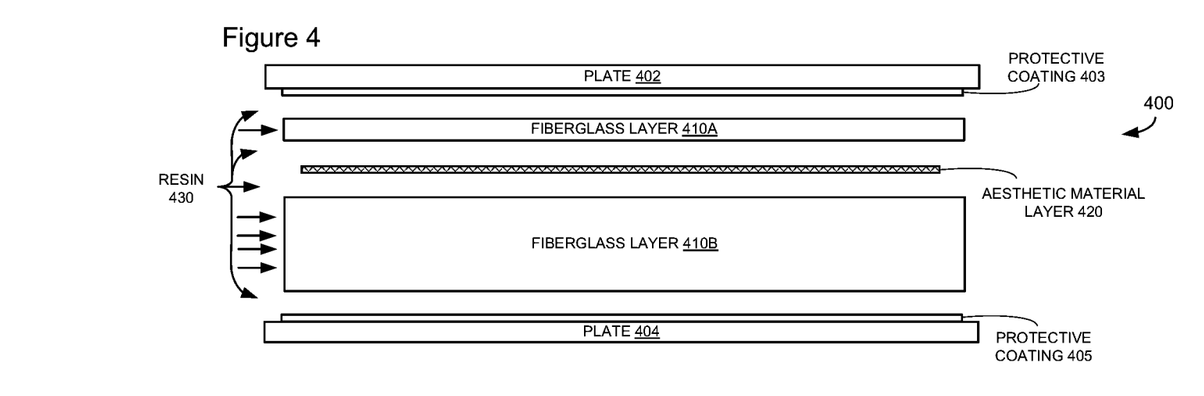
FIGS. 4-7 are flow diagrams showing example exploded side-views of the solid-core panels according to embodiments of the invention.

FIGS. 4-7 are flow diagrams showing example exploded side-views of solid-core panels during manufacture according to embodiments of the invention. Referring to FIG. 4, a flow diagram 400 shows an exploded-side view of the solid-core panel 100 during manufacture. The flow diagram 400 includes a material section having fiberglass layers 410A and 410B located to the top and bottom of the aesthetic material layer 420. Although FIG. 4 shows two distinct fiberglass layers 410A and 410B, in some embodiments, the material section can include additional fiberglass layers or the fiberglass layers themselves may comprise multiple fiberglass layers.

During manufacture, this material section is saturated or impregnated with resin 430, which "wets out" both the fiberglass layers 410A and 410B and the aesthetic material layer 420. The "wetting out" of the material layer section with the resin 430, allows for the creation of a solid-core that encapsulates the aesthetic material layer 420 when the resin 430 cures. As will be described below in greater detail, there are several ways of impregnating the material section with resin 430, such as in a layer-by-layer process or through an injection mold process.

A pair of plates 402 and 404 can be utilized to form the top and bottom surfaces of the solid-core panel 100 as the combination of the resin 430 and the material section cure. Although not shown in FIG. 4, a mold can form the sides of the solid-core panel 100 and control the location of the plates 402 and 404. The texture of the plates 402 and 404 can dictate the resulting surface in the solid-core panel 100. For instance, the plates 402 and 404 can have smooth, textures, or shaped surfaces, which allows the solid-core panel 100 to have corresponding smooth, textured, or shaped surfaces.

In some embodiments, a protective coating material 403 and 405 is applied to one or more of the plates 402 and 404, which is allowed to combine with the resin 430. The protective coating material 403 and 405 can be a polyurethane-based product, a clear coat polymer, or a gel coat polymer that, when integrated with the resin 430, causes the exterior surface of the solid-core panel 100 to harden into the protective coatings 112 and 114, respectively. In other embodiments, the protective coating material 403 and 405 can be applied after the resin 430 has saturated the material section and has begun to cure, i.e., through a spray-on process.

Figure 5:
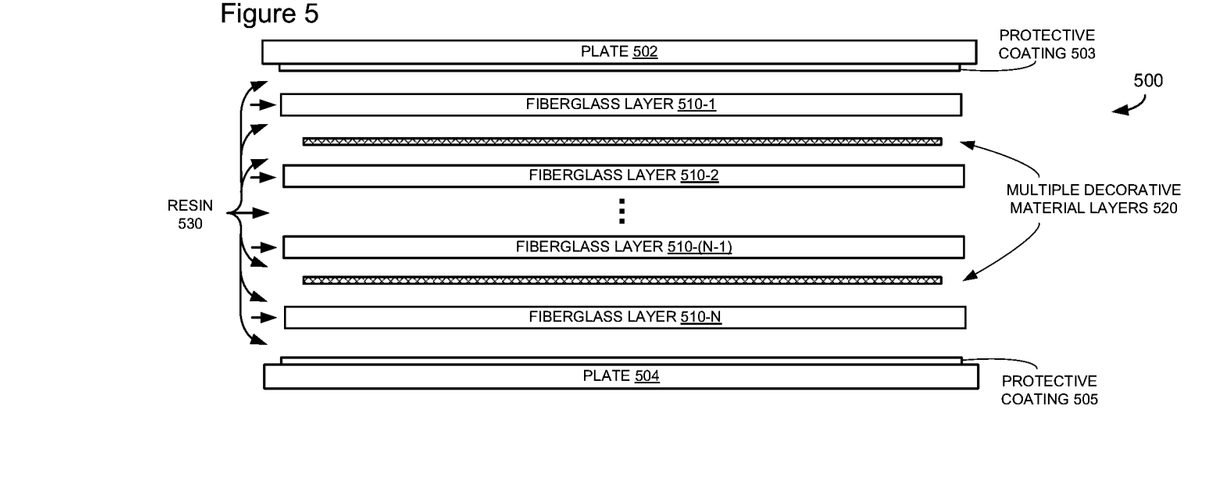
Figure 6:
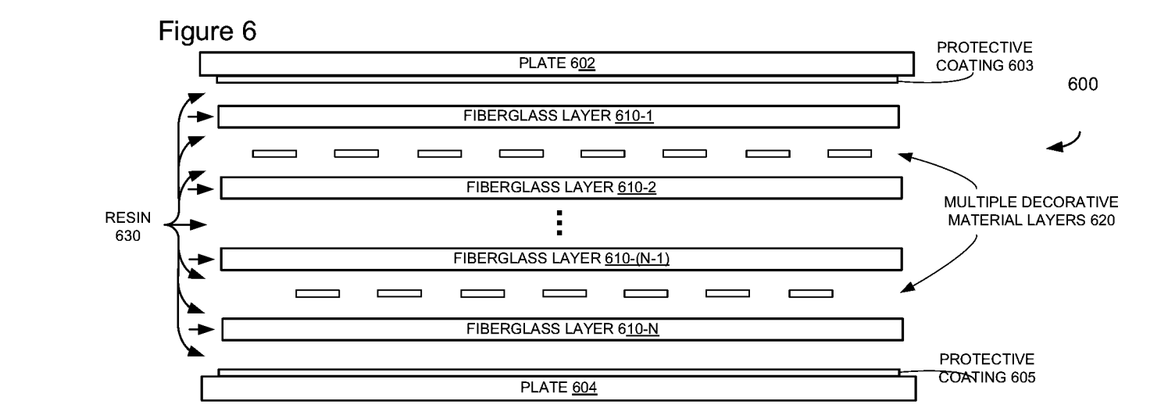

Referring to FIGS. 5 and 6, flow diagrams 500 and 600 show exploded-side views of the solid-core panels 150 and 200 during manufacture. The flow diagrams 500 and 600 are similar to flow diagram 400, with the following differences. The material section of flow diagram 500 includes multiple decorative material layers 520 interleaved between fiberglass layers 510-1 to 510-N. The material section of flow diagram 600 includes multiple decorative material layers 620 interleaved between fiberglass layers 610-1 to 610-N.

In flow diagram 500, the decorative or functional material layers 520 can be a relatively flat material relative to the top and bottom surfaces of the solid-core panel 150, for instance, decorative paper, film, fabric or other woven material, tissue, or other organic material, while in other embodiments, the decorative of functional material can be any size. In some embodiments, one or more of the decorative material layers 520 can include functional material, such as solar fabric, solar cells, strengthening material, or other electronics.

In flow diagram 600, the decorative material layers 620 can be organic material, such as flower petals, which are spread out over multiple layers in the solid-core panel 200. In some embodiments, one or more of the decorative material layers 620 can include functional material, such as solar fabric, solar cells, strengthening material, or other electronics.

During manufacture, the material section is saturated or impregnated with resin 530 or 630, which "wets out" both the fiberglass layers 510-1 to 510-N or 610-1 to 610-N and the decorative or functional material layers 520 or 620. The "wetting out" of the material section with the resin 530 or 630, allows for the creation of a solid-core that encapsulates the material layers 520 or 620 when the resin 530 or 630 cures.

The fiberglass layers 510-1 to 510-N and 610-1 to 610-N can help hold the decorative material in place during the application of the resin 530 or 630. For example, when utilizing an injection mold process to apply the resin 530 or 630 to the material sections, the resin 530 or 630 is injected into one side of a mold and vacuumed towards and exit. Typically, any loose material, such as flower petals, paper, or other aesthetic materials, would shift during the injection process due to the flow and pressure of the resin 530 or 630. By interleaving the decorative or functional material 520 and 620 with the fiberglass layers 510-1 to 610-N or 610-1 to 610-N, the decorative or functional material 520 and 620 can substantially maintain its intended position within the resulting solid-core panel 150 or 200.

Figure 7:
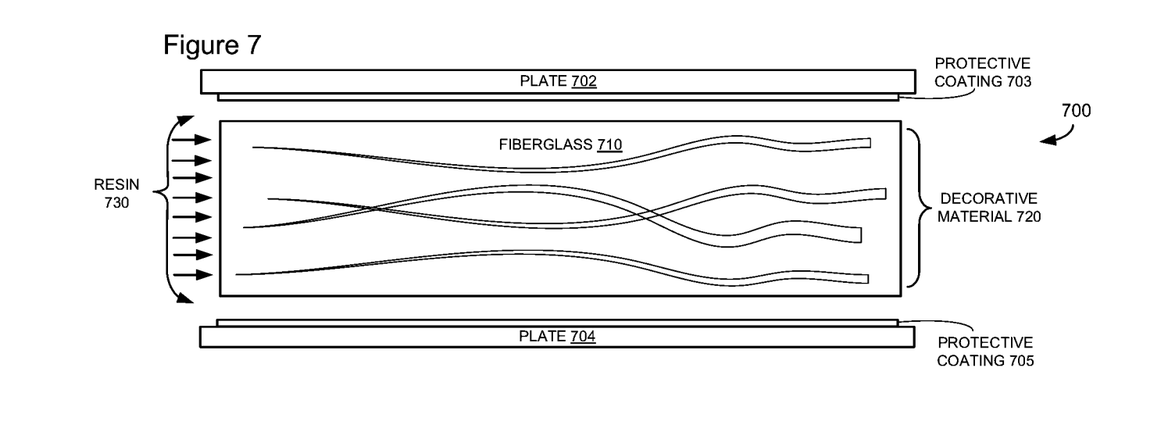

Referring to FIG. 7, a flow diagram 700 shows an exploded-side view of the solid-core panel 300 during manufacture. The flow diagram 700 is similar to flow diagram 400, with the following differences. The material section of flow diagram 700 includes decorative material 720 intertwined or incorporated within fiberglass 710. The incorporation of the decorative material 720 with the fiberglass 710 prior to application of the resin 730, as opposed to layering described above in FIGS. 4-6, allows for a three-dimensional placement of the decorative (or functional) material 720 in the solid-core panel 300.

During manufacture, the material section is saturated or impregnated with resin 730, which "wets out" the fiberglass 710 and the decorative material 720. The "wetting out" of the material section with the resin 730, allows for the creation of a solid-core that encapsulates the decorative material 720 when the resin 730 cures.

The fiberglass 710 can also hold the decorative (or functional) material 720 in place while the resin 730 is applied and curing. For example, when utilizing an injection mold process to apply the resin 730 to the combination of fiberglass 710 and decorative material 720, the resin 730 is injected into one side of a mold and vacuumed towards and exit. By incorporating the decorative material 720 with the fiberglass 710, the decorative material 720 can substantially maintain its intended position within the resulting solid-core panel 300.

Figure 8:
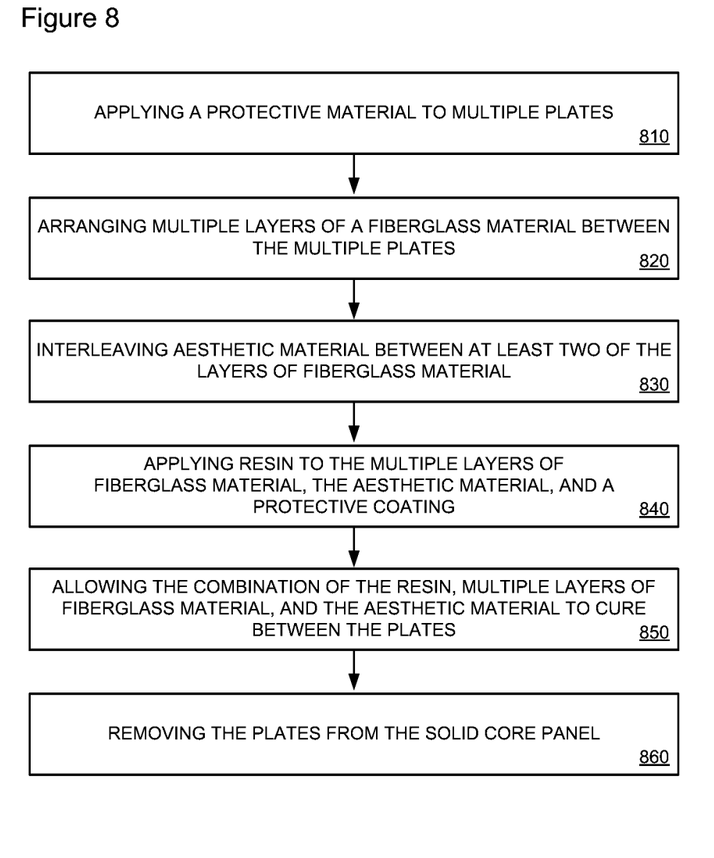
FIGS. 8-9 are flowcharts illustrating example embodiments for creating the solid-core panels according to embodiments of the invention.
Figure 9:
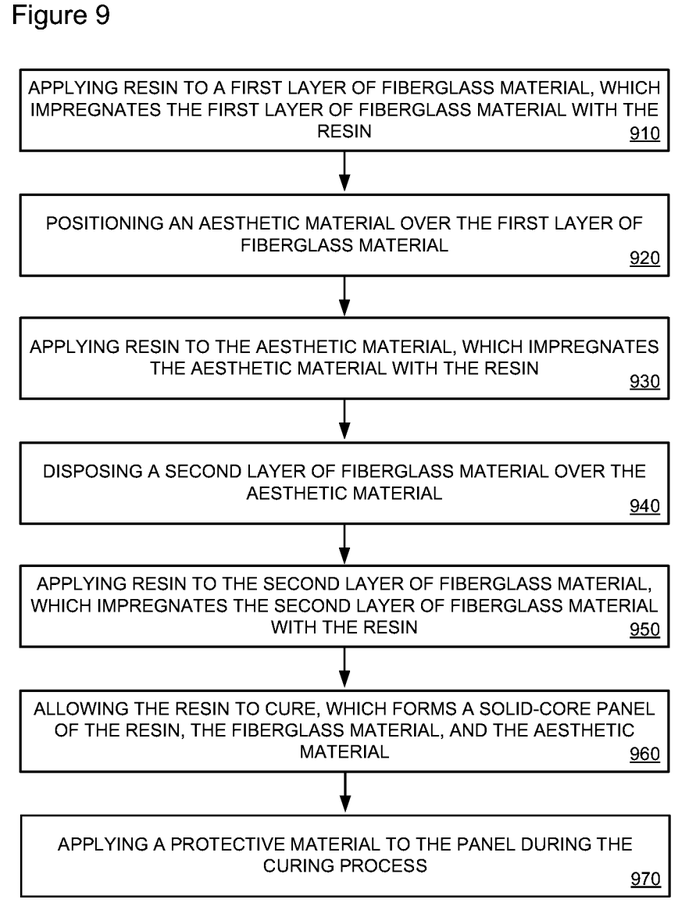

FIGS. 8-9 are flowcharts illustrating example embodiments for creating the solid-core panels according to embodiments of the invention. Referring to FIG. 8, a flowchart 800 describes a process for manufacturing a solid-core panel. In a first block 810 of the manufacturing process, a protective material is applied to multiple plates. The protective material can be a clear or translucent coating material that, for example, is a polyurethane-based product, a clear coat polymer, or a gel coat polymer.

In next blocks of the manufacturing process, multiple layers of a fiberglass material are arranged between the multiple plates (block 820) and the aesthetic material is interleaved between at least two of the layers of fiberglass material (block 830). The arrangement of the fiberglass layers and the aesthetic material can define the aesthetics of the resultant solid-core panel, such as the thickness of the panel, the depth and positioning of the aesthetic material in the solid-core panel, and clarity of the solid-core panel.

In a next block 840 of the manufacturing process, a resin is applied to the multiple layers of fiberglass material, the aesthetic material, and the protective material. The resin can be injected into the fiberglass material, the aesthetic material, and the protective material, for example, in an injection mold process. The resin can impregnate the fiberglass material, the aesthetic material, and the protective material—wetting it out. When the resin combines with the protective material, the resulting combination can form a protective coating that is integrated into the solid-core panel.

In a next block 850 of the manufacturing process, the combination of the resin, multiple layers of fiberglass material, the aesthetic material, and protective material is allowed to cure between the plates, forming a solid-core panel encapsulating the aesthetic material. As discussed above, the plates can be smooth, textured, and/or contoured, which forms the surfaces of the resulting solid-core panel as it cures. The plates can be clamped, pressed, and/or bolted during the curing process to help ensure the surfaces of the resulting solid-core panel are formed with the desired shape and texture. In some embodiments, during the curing process, the use of plates allows the uncured panel to be removed from a mold and placed in a cure section or cart, and/or exposed to ultraviolet (UV) lights to speed up the curing process, which allows for a sped-up reuse of the mold for manufacture of additional panels.

In a next block 860 of the manufacturing process, the plates are removed from the solid core panel. In some embodiments, the solid-core panel can be cut, for example, with a water jet, into customizable sizes.

Referring to FIG. 9, in a first block 910 of another manufacturing process, a resin is applied to a first layer of fiberglass material, which impregnates the first layer of fiberglass material with the resin. The first layer of the fiberglass material can be arranged on top of a plate and/or in a mold prior to applying the resin to the fiberglass material.

In the next blocks of the manufacturing process, an aesthetic material is positioned over the first layer of fiberglass material (block 920) and resin is applied to the aesthetic material, which impregnates the aesthetic material with the resin (block 930). In the next blocks of the manufacturing process, a second layer of fiberglass material is disposed over the aesthetic material (block 940) and resin is applied to the second layer of fiberglass material, which impregnates the second layer of fiberglass material with the resin (block 950).

In a next block 960 of the manufacturing process, the resin is allowed to cure, which forms a solid-core panel of the resin, the fiberglass material, and the aesthetic material. In some embodiments, another plate is placed on top of the last layer of fiberglass material impregnated with resin. As discussed above, the plates can form the surfaces of the solid-core panel and help to expedite the manufacturing process.

In a next block 970 of the manufacturing process, a protective material is applied to the panel during the curing process. The protective material is configured to combine with the resin to form a protective coating that is integrated into the soli-core panel. In some embodiments, the protective material can be sprayed on after a period of curing has occurred.

One of skill in the art will recognize that the concepts taught herein can be tailored to a particular application in many other ways. In particular, those skilled in the art will recognize that the illustrated embodiments are but one of many alternative implementations that will become apparent upon reading this disclosure.

The preceding embodiments are examples. Although the specification may refer to "an", "one", "another", or "some" embodiment(s) in several locations, this does not necessarily mean that each such reference is to the same embodiment(s), or that the feature only applies to a single embodiment.

The invention claimed is:

1. A method comprising:
   applying a protective material directly to at least one of multiple plates;
   arranging multiple layers of a fiberglass material between the multiple plates;
   interleaving aesthetic material between at least two of the layers of fiberglass material; and
   applying resin to the multiple layers of fiberglass material and the aesthetic material between the multiple plates after applying the protective material to at least one of multiple plates, wherein the protective material is a different material than the resin, wherein the resin combines with the multiple layers of fiberglass material and cures to form a solid-core panel encapsulating the aesthetic material, and wherein the resin combines with the protective material and cures to form a protective coating that is integrated into the solid-core panel.

2. The method of claim 1, wherein the applying of the resin to the multiple layers of fiberglass material and the aesthetic material is performed in an injection mold process.

3. The method of claim 1, wherein the protective material is a clear coat, a gel coat, or a polyurethane-based material.

4. The method of claim 1 further comprises:
   removing at least one of the plates from the combination of the resin, the multiple layers of fiberglass material, and the aesthetic material; and
   applying another protective material to one or more surfaces of the solid-core panel after removing at least one of the plates.

5. The method of claim 1, wherein the interleaving of the aesthetic material further comprises forming multiple levels of the aesthetic material between the layers of the fiberglass material.

6. The method of claim 1, wherein the aesthetic material includes at least one of a solar cell device or a solar fabric.

7. The method of claim 1, wherein the aesthetic material is a decorative organic material including at least one of a paper, tissue, fabric, or plant material.

\* \* \* \* \*